United States Patent
Stekolnikov et al.

(10) Patent No.: US 9,231,125 B2
(45) Date of Patent: Jan. 5, 2016

(54) SOLAR CELL AND METHOD FOR PRODUCING SAME

(75) Inventors: Andrey Stekolnikov, Leipzig (DE);
Robert Seguin, Berlin (DE);
Maximilian Scherff, Dortmund (DE);
Peter Engelhart, Leipzig (DE);
Matthias Heimann, Dresden (DE); Til Bartel, Berlin (DE); Markus Träger, Leipzig (DE); Max Köntopp, Berlin (DE)

(73) Assignee: HANWHA Q CELLS GMBH, Bitterfeld-Wolfen (DE)

( * ) Notice: Subject to any disclaimer, the term of this patent is extended or adjusted under 35 U.S.C. 154(b) by 81 days.

(21) Appl. No.: 14/235,674

(22) PCT Filed: Jun. 26, 2012

(86) PCT No.: PCT/DE2012/100189
§ 371 (c)(1),
(2), (4) Date: Apr. 18, 2014

(87) PCT Pub. No.: WO2013/013666
PCT Pub. Date: Jan. 31, 2013

(65) Prior Publication Data
US 2014/0224316 A1    Aug. 14, 2014

(30) Foreign Application Priority Data
Jul. 28, 2011  (DE) .......................... 10 2011 052 256

(51) Int. Cl.
*H01L 31/0224*  (2006.01)
*H01L 31/02*  (2006.01)
*H01L 31/068*  (2012.01)

(52) U.S. Cl.
CPC .. *H01L 31/02008* (2013.01); *H01L 31/022425* (2013.01); *H01L 31/068* (2013.01); *Y02E 10/547* (2013.01)

(58) Field of Classification Search
CPC ................... H01L 31/0224; H01L 31/022425; H01L 31/02008; H01L 31/068
USPC ............................................. 136/256; 438/98
See application file for complete search history.

(56) References Cited

U.S. PATENT DOCUMENTS 4,228,315 A * 10/1980 Napoli ............ H01L 31/022433
136/256
4,320,250 A *  3/1982 Corwin ........... H01L 31/022425
136/255

(Continued)

FOREIGN PATENT DOCUMENTS

CN       101 447 532 A     6/2009
CN        101720512 A      6/2010

(Continued)

OTHER PUBLICATIONS

International Search Report for PCT Application No. PCT/DE2012/100189, dated Sep. 3, 2013.

*Primary Examiner* — Golam Mowla
(74) *Attorney, Agent, or Firm* — Heslin Rothenberg Farley Mesiti, PC; Victor Cardona

(57) ABSTRACT

A solar cell includes a semiconductor wafer, at least one dielectric layer arranged on the semiconductor wafer, a metal layer arranged on the dielectric layer, and a contact structure arranged in the dielectric layer such that the contact structure provides an electrical connection between the metal layer and the semiconductor wafer. The contact structure has at least one first structure having a minimum dimension and at least one second structure having a maximum dimension, wherein the minimum dimension and the maximum dimension are defined along a surface of the semiconductor wafer and the minimum dimension of the first structure is greater than the maximum dimension of the second structure.

15 Claims, 7 Drawing Sheets

(56) References Cited

U.S. PATENT DOCUMENTS

| | | | | |
|---|---|---|---|---|
| 4,593,304 | A * | 6/1986 | Slayman | H01L 31/02161 257/457 |
| 5,258,077 | A * | 11/1993 | Shahryar | H01L 31/068 136/256 |
| 5,279,682 | A * | 1/1994 | Wald | H01L 31/022425 136/256 |
| 5,290,367 | A * | 3/1994 | Hayashi | H01L 31/022425 136/255 |
| 6,168,968 | B1 * | 1/2001 | Umemoto | B23K 26/0656 136/244 |
| 6,552,414 | B1 * | 4/2003 | Horzel | H01L 21/67109 257/186 |
| 6,927,417 | B2 * | 8/2005 | Nagashima | H01L 31/02167 136/249 |
| 7,842,596 | B2 | 11/2010 | Rohatgi et al. | |
| 7,943,146 | B2 | 5/2011 | Hobden et al. | |
| 2005/0172996 | A1 * | 8/2005 | Hacke | H01L 31/022433 136/256 |
| 2009/0325327 | A1 | 12/2009 | Rohatgi et al. | |
| 2010/0032013 | A1 | 2/2010 | Krause et al. | |
| 2010/0275965 | A1 | 11/2010 | Lee et al. | |
| 2010/0275993 | A1 | 11/2010 | Kim et al. | |

FOREIGN PATENT DOCUMENTS

| | | |
|---|---|---|
| DE | 10 2009 011 306 A1 | 9/2010 |
| EP | 2 187 444 A1 | 5/2010 |
| WO | 2008/137174 A1 | 11/2008 |

* cited by examiner

SOLAR CELL AND METHOD FOR PRODUCING SAME

CROSS REFERENCE TO RELATED APPLICATIONS

This application is a national stage filing under section 371 of International Application No. PCT/DE2012/100189, filed on Jun. 26, 2012, and published in German on Jan. 31, 2013, as WO 2013-013666 A2 and claims priority of German application DE 10 2011 052 256.5 filed on Jul. 28, 2011, the entire disclosures of these applications being hereby incorporated herein by reference.

The present invention relates to a solar cell and to a method for producing same. In particular, the present invention relates to a solar cell having a specific point contact structure for the interconnection of solar cells on metal paste such as aluminum paste, for example, and to a method for producing same.

BACKGROUND ART

The vast majority of present-day silicon solar cells comprise a printed and fired rear-side metallization of aluminum-containing paste and silver-containing paste. The silver-containing paste regions on the rear side are necessary for interconnecting a plurality of solar cells by conventional soldering with tin-plated copper ribbons. There are a number of problems here, however. For cost reasons and also for increasing the efficiency of solar cells it is desirable to avoid the silver paste regions on the rear side of the solar cell and to strive for a whole-area aluminum paste metallization on the rear side. For increasing the efficiency of solar cells it is advantageous, moreover, to insert a passivating dielectric layer between rear-side metallization and silicon surface. One challenge here is to realize a sufficiently high adhesion of metal layer on the dielectric layer. With the use of silver paste regions (so-called busbar regions for soldering), the adhesion is realized by the silver paste penetrating through the dielectric layer and thereby producing sufficiently high adhesion with the silicon wafer.

BRIEF SUMMARY of INVENTION

It is an object of the present invention to provide a solar cell having a sufficiently high adhesion force between the semiconductor wafer/dielectric layer/metal layer in solar cells having dielectric passivation for a possible direct interconnection of the metal layer, and a method for producing same.

This object is achieved according to the invention by means of a solar cell as claimed in claim 1 and a solar cell production method as claimed in claim 9.

Advantageous configurations of the present invention are specified in the dependent claims.

The present invention relates to a solar cell comprising a semiconductor wafer, at least one dielectric layer arranged on the semiconductor wafer, a metal layer arranged on the dielectric layer, and a contact structure arranged in the dielectric layer, such that the contact structure provides an electrical connection between the metal layer and the semiconductor wafer. The contact structure has at least one first structure having a minimum dimension and at least one second structure having a maximum dimension. The minimum dimension and the maximum dimension are defined along a surface of the semiconductor wafer. The minimum dimension of a structure is therefore the smallest dimension of the structure along the surface of the semiconductor wafer, while the maximum dimension of the structure is the largest dimension of the structure along the surface of the semiconductor wafer. By definition, a circular structure has a minimum dimension and a maximum dimension which are identical. According to the invention, the minimum dimension of the first structure is greater than the maximum dimension of the second structure.

The present invention proposes a contact structure in the dielectrically passivated layer of solar cells which provides a high adhesion force between semiconductor wafer/dielectric layer/metal layer in solar cells having dielectric passivation for a possible direct interconnection of the metal layer. In this case, the use of silver in the solar cell can be avoided and costs can thus be saved. The efficiency of the solar cell is higher in comparison with a conventional solar cell.

The semiconductor wafer is preferably a silicon wafer. One example of a dielectric layer is an aluminum oxide or silicon nitride layer. The metal layer is an aluminum layer, for example.

The contact structure constitutes a combination of a first structure and a second structure which have different dimensions. The minimum dimension of the first structure is greater than the maximum dimension of the second structure. As a result, the metal layer and the semiconductor wafer have—in comparison with one another—larger-area and smaller-area connection points, which results in a point contact structure whose adhesion acting over a larger and a smaller area in the solar cell can be provided in accordance with the dimensions of the solar cell and the adhesion requirements at specific locations of the solar cell. The arrangement of the second structure with small-area adhesion between first structures affords, for example, an additional adhesion in comparison with a solar cell without second structure, if the latter either has no adhesion at all in this region, i.e. if the first structure is not arranged in this region either, or a material saving in comparison with a solar cell without a second structure, if the solar cell without a second structure has the first structure in this region. Solar cells which have only the second structure, but not the first structure, have a poorer adhesion between semiconductor wafer/dielectric layer/metal layer in comparison with the solar cell according to the invention. An optimum adhesion can be achieved by the combination of the first and second structures in the solar cell.

In one preferred embodiment of the solar cell, the minimum dimension of the first structure is in the millimeters range and the maximum dimension of the second structure is in the micrometers range. The choice of the minimum dimension of the first structure in the millimeters range and the maximum dimension of the second structure in the micrometers range makes it possible to arrange structures of different sizes in the dielectric layer and to produce a solar cell having a high adhesion capability between semiconductor wafer/dielectric layer/metal layer. Besides the provision of large-area adhesion regions, the adhesion capability is additionally increased by small-area adhesion regions, without eliminating the dielectric layer and the properties thereof.

The millimeters range preferably comprises 0.1 to 10 mm, more preferably 1 to 7 mm, even more preferably 3 to 5 mm. The micrometers range preferably comprises 10 to 70 µm, more preferably 20 to 60 µm, even more preferably 30 to 55 µm. The combination of structures having these orders of magnitude provides a point contact structure which realizes a good adhesion between semiconductor wafer/dielectric layer/metal layer.

In one preferred embodiment, the solar cell comprises as the first structure an aluminum-silicon eutectic and/or as the second structure a silicon-metal contact or a laser fired contact (LFC). The aluminum-silicon eutectic constitutes a firm, stable structure. The cohesive connection of the metal layer, which is an aluminum layer in this case, and the semiconductor wafer, which is a silicon wafer in this case, improves the adhesion capability between the aluminum layer and silicon wafer. The laser firing of a contact has the advantage of being able to produce said contact in small dimensions without any problems and of locally producing a connection between the metal such as aluminum, for example, and wafer such as silicon wafer, for example, and of thus improving the adhesion between metal layer and wafer.

Preferably, the first structure has a strip-type shape. In this case, the minimum and maximum dimensions of the first structure deviate greatly from one another. The strip-type shape is suitable for interconnection with a connector for interconnecting solar cells such as an interconnecting ribbon.

The second structure preferably has a punctiform shape. The minimum and maximum dimensions of the second structure can be identical or different. If they are different, however, they are preferably approximately identical, such that the second structure has a punctiform shape.

The first structure affords a large-area arrangement of an adhesion region for the metal layer and wafer, while the second structure affords a small-area adhesion region that supports the adhesion effect of the first structure, such that the removal of the dielectric layer in order to obtain adhesion by the arrangement of a contact structure takes place to a small extent and the properties of the dielectric layer are largely maintained. In other words, the increase in the efficiency of the solar cell by the arrangement of the dielectric layer is maintained on account of the removal of the dielectric layer to a small extent and the insertion of a contact structure into the dielectric layer, and a stable solar cell having layer components adhering to one another is additionally provided.

The choice of a strip-type shape for the first structure and a punctiform shape for the second structure realizes a contact structure having a very good adhesion between semiconductor wafer/dielectric layer/metal layer by virtue of having a first structure having large-area adhesion and a second structure having small-area adhesion in comparison with the first structure. The arrangement of the second structure with small-area adhesion between first structures affords an additional adhesion or a material saving in comparison with a solar cell without a second structure. The provision of large-area and small-area structures furthermore makes it possible to arrange adhesion points with sizes that can be adapted to the solar cell according to requirements.

In one preferred embodiment, on a surface of the metal layer which faces away from the semiconductor wafer, a connector is arranged in a region which overlaps the first structure in plan view. The connector is preferably an aluminum ribbon. The connector is suitable for interconnecting the solar cell with further solar cells.

Preferably, the first structure comprises an aluminum-silicon eutectic which is directly contact-connected to a connector. In this case, the semiconductor wafer is a silicon wafer and the metal layer is an aluminum layer. The connector is preferably an aluminum ribbon. The connector and the aluminum-silicon eutectic can form a cohesive connection. By way of example, a cohesive contact is produced at room temperature by ultrasonic cold welding. The efficiency of the solar cell can furthermore be increased by means of the area comprising aluminum and aluminum-silicon eutectic. A better passivation of the rear side of the solar cell is achieved as a result. Furthermore, the production costs of such a solar cell are reduced if a connector composed of aluminum is used, since the silver busbars customary heretofore are obviated.

The present invention furthermore relates to a solar cell production method, comprising the following method steps: providing a semiconductor wafer with at least one dielectric layer, forming a metal layer on the dielectric layer and a contact structure arranged in the dielectric layer such that the contact structure provides an electrical connection between the metal layer and the semiconductor wafer wherein at least one first structure having a minimum dimension and at least one second structure having a maximum dimension are formed as contact structure, such that the minimum dimension of the first structure is greater than the maximum dimension of the second structure.

The at least one first and second structure can be produced in various ways, described below. The first and second structures can be produced by the same or a different method step. The formation of the first and second structures can be carried out independently of one another. The setting of the minimum dimension of the first structure and the maximum dimension of the second structure is method-dependent.

In one preferred embodiment of the production method forming the metal layer and the contact structure comprises the following method steps: applying at least one metal paste which is inert with respect to the dielectric layer and at least one metal paste which is reactive with respect to the dielectric layer to the dielectric layer, such that the metal paste which is reactive with respect to the dielectric layer forms at least one first region and/or at least one second region in the metal paste which is inert with respect to the dielectric layer; and firing, such that the metal paste which is reactive with respect to the dielectric layer and forms the first and/or second region penetrates through the dielectric layer and forms the first structure and/or the second structure. The application of the metal pastes which are inert and reactive with respect to the dielectric layer to the dielectric layer can be realized by means of screen printing. The minimum dimension of the first structure and the maximum dimension of the second structure are set by the size of the holes of the screen. After firing, the metal paste which is inert with respect to the dielectric layer forms the metal layer on the dielectric layer, and the metal paste which is reactive with respect to the dielectric layer penetrates through the dielectric layer and forms the first and/or second structure. The metal paste which is inert with respect to the dielectric layer is preferably a metal paste such as an aluminum paste containing metal, preferably in powder form, and optionally at least one additive which is inert with respect to the dielectric layer, such as, for example, a binder, solvent or sintering aid. The paste which is reactive with respect to the dielectric layer is preferably a metal paste containing metal such as, for example, a metal powder, at least one additive which is reactive with respect to the dielectric layer, such as an etchant, for example, and optionally at least one additive that is inert with respect to the dielectric layer, such as, for example, a binder, solvent or sintering aid. By way of example, the paste which is reactive with respect to the dielectric layer is an aluminum paste containing glass frit as etchant.

In a further preferred embodiment, forming the metal layer and the contact structure comprises the following method steps: forming at least one first hole suitable for producing the first structure and/or at least one second hole suitable for producing the second structure in the dielectric layer; and filling the at least one first hole and/or at least one second hole and coating the dielectric layer with a metal paste; and firing. In this method variant, the dielectric layer is perforated, and the holes produced by the perforation are filled with metal paste. An aluminum paste is preferably used as metal paste. The metal paste is inert with respect to the dielectric layer. The minimum dimension of the first structure and the maximum dimension of the second structure are set by the setting of the tool used during the perforation of the dielectric layer. The semiconductor wafer is exposed at locations at which there is the at least one first and/or second hole in the dielectric layer. The aluminum paste, during firing with a silicon wafer, can form an aluminum-silicon eutectic that constitutes a very firm adhesion structure between metal, dielectric layer and silicon wafer.

Preferably, the at least one first hole and/or the at least one second hole are formed by means of laser ablation. Laser ablation allows the dielectric layer to be perforated, without the dielectric layer acquiring cracks or breaking at locations at which it is intended to remain intact. Laser ablation makes it possible to produce holes in the dielectric layer with the desired size with pinpoint accuracy. Alternatively, it is possible to produce the hole mechanically. As a further alternative, it is possible to produce the hole wet-chemically.

In one preferred embodiment, the second structure is produced in the form of LFC (laser fired contacts). In this case, a connection between semiconductor wafer and metal is produced locally. If the semiconductor wafer is a silicon wafer and the metal layer is an aluminum layer, then an aluminum-silicon eutectic is produced locally.

The first structure and the second structure can thus be produced by different method steps. By way of example, the first structure can be produced by the above-described application of a metal paste which is reactive with respect to the dielectric layer, and subsequent firing, and the second structure can be produced in the form of LFC. Alternatively, the first structure can be produced by the above-described procedure of forming a hole in the dielectric layer and filling the hole with a metal paste which is inert with respect to the dielectric layer, and subsequent firing, and the second structure firing and the second structure can be produced in the form of LFC. As a further alternative, the first structure can be produced by the above-described application of a metal paste which is reactive with respect to the dielectric layer, and the second structure can be produced by the above-described procedure of forming a hole in the dielectric layer and filling the hole with a metal paste which is inert with respect to the dielectric layer, and subsequent firing. As a further alternative, the first structure can be produced by the above-described procedure of forming a hole in the dielectric layer and filling the hole with a metal paste which is inert with respect to the dielectric layer, and the second structure can be produced by the above-described application of a metal paste which is reactive with respect to the dielectric layer, and subsequent firing.

Furthermore, the first structure and the second structure can be produced by a common method step. By way of example, the first structure and the second structure can be produced by the above-described application of a metal paste which is reactive with respect to the dielectric layer, and subsequent firing. Alternatively, the first structure and the second structure can be produced by the above-described procedure of forming holes in the dielectric layer and filling the holes with a metal paste which is inert with respect to the dielectric layer, and subsequent firing.

In one preferred embodiment of the production method, at least one connector is applied on a surface of the metal layer which faces away from the semiconductor wafer in at least one region which overlaps the first structure in plan view. The connector is applied by means of bonding or soldering, for example, and is preferably an aluminum ribbon suitable for interconnection with further solar cells.

Preferably, the production method comprises the step of exposing an aluminum-silicon eutectic in at least one first structure and ultrasonic cold welding of the aluminum-silicon eutectic of the first structure to a respective connector. In this case, the semiconductor wafer is a silicon wafer and the metal layer is an aluminum layer. The exposure can be effected by means of laser ablation. Alternatively, the exposure can also be effected by mechanical perforation of the metal layer. By means of ultrasonic cold welding, the aluminum-silicon eutectic is cohesively contact-connected to the connector such as an aluminum tape, for example. The at least one first and at least one second structure of such a solar cell can be produced by any of the above-described method steps for forming the first and/or second structure.

The present invention will now be explained in greater detail with reference to figures, without restricting the invention to this.

BRIEF DESCRIPTION OF THE DRAWING FIGURES

DETAILED DESCRIPTION

Figure 1:
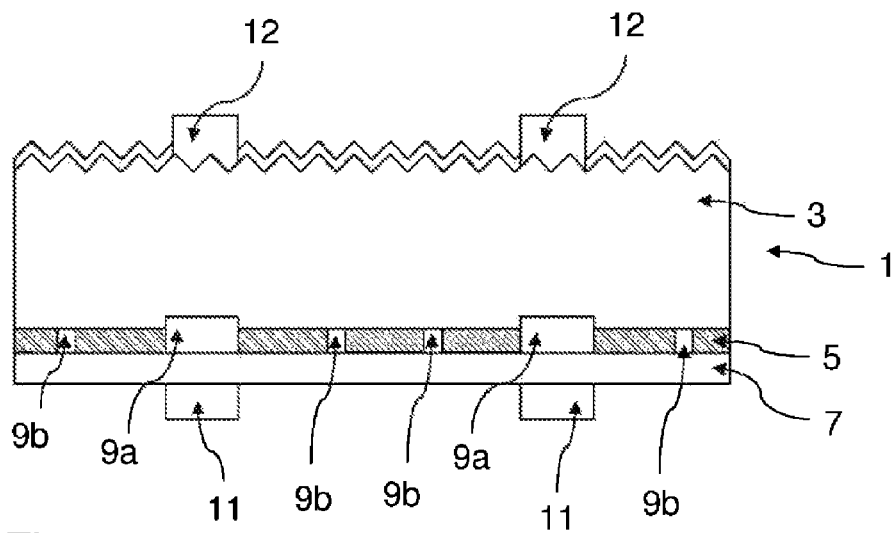
FIG. 1 shows a cross-sectional view of a solar cell according to the invention.

FIG. 1 shows a cross-sectional view of a solar cell 1 according to the invention. The solar cell 1 comprises a semiconductor wafer 3 such as a silicon wafer, for example. A dielectric layer 5 is arranged on the rear side of the semiconductor wafer 3. Furthermore, the solar cell 1 has two first structures 9a. The first structures 9a are arranged in the dielectric layer 5 and project partly into the semiconductor wafer 3. Furthermore, second structures 9b (four of which are visible) are arranged in the dielectric layer 5, the maximum dimension of said second structures being less than the minimum dimension of the first structure 9a. The dielectric layer 5, the first structures 9a and the second structures 9b are covered by a metal layer 7 such as an aluminum layer, for example. Two interconnecting ribbons 12 composed of aluminum, for example, are arranged on the front side of the semiconductor wafer 3. On the rear side of the solar cell 1, as connectors, two interconnecting ribbons 11, for example aluminum ribbons, are arranged on the metal layer 7 in regions which overlap the first structures 9a in plan view.

Figure 2:
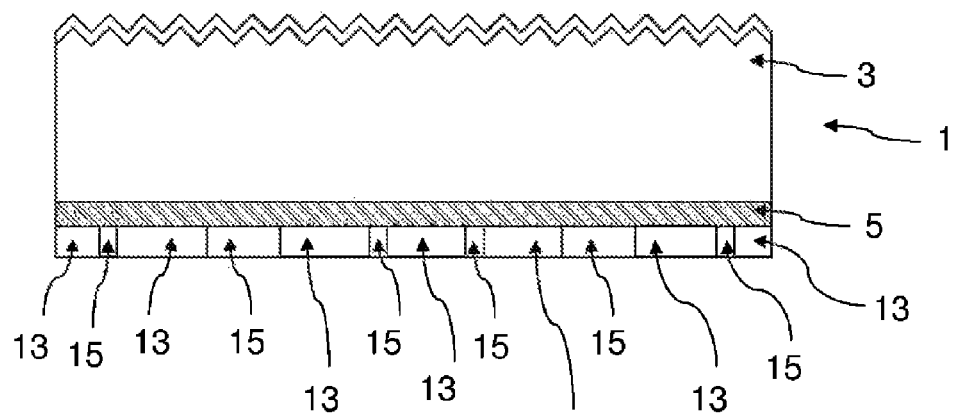
FIG. 2 shows a cross-sectional view of the solar cell in accordance with FIG. 1 before the firing step.

FIG. 2 shows a cross-sectional view of the solar cell 1 in accordance with FIG. 1 before the firing step. The solar cell 1 comprises the semiconductor wafer 3 and the dielectric layer 5 arranged thereon. A metal paste layer is arranged on the dielectric layer 5. The metal paste layer comprises a metal paste 13 which is inert with respect to the dielectric layer, and a metal paste 15 which is reactive with respect to the dielectric layer. The metal pastes 13 and 15 are applied by means of screen printing methods. During the firing of the solar cell 1 illustrated in FIG. 2, the metal paste 15 which is reactive with respect to the dielectric layer 5 penetrates through the dielectric layer 5 and forms the structures 9a and 9b illustrated in FIG. 1, and the metal paste which is inert with respect to the dielectric layer 5 forms the metal layer 7.

Figure 3:
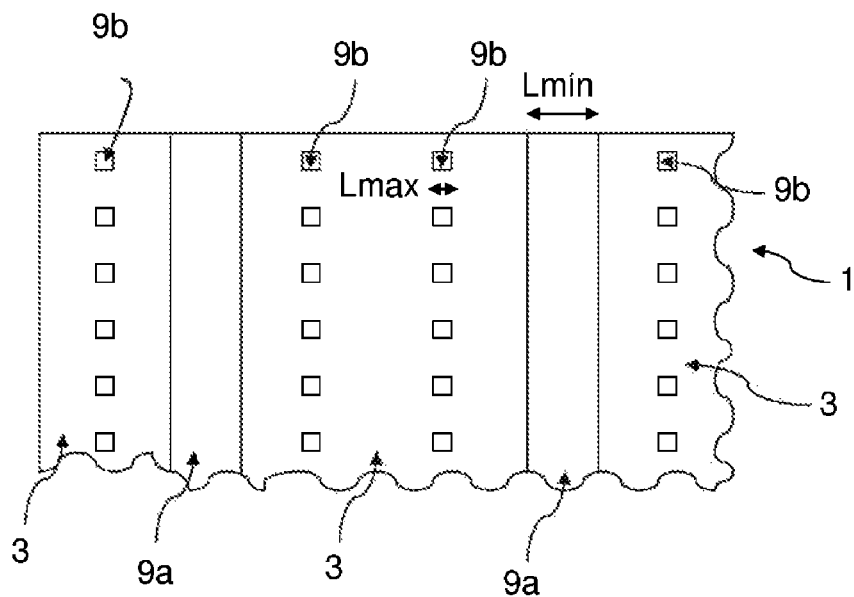
FIG. 3 shows a partial cross-sectional view of the solar cell in accordance with FIG. 1.

FIG. 3 shows a partial cross-sectional view of the solar cell in accordance with FIG. 1. It shows a cross section through the dielectric layer 5 of the solar cell 1 parallel to the layer plane. The first and second structures 9a (two of which are shown) and 9b (twenty-four of which are shown) are arranged in the dielectric layer 5. The first structure 9a has a strip-type shape in each case, while the second structure 9b has a punctiform shape in each case. The minimum dimension Lmin of the first structure 9a is greater than the maximum structure Lmax of the second structure 9b. The arrangement of the first and second structures 9a and 9b as shown in FIG. 3 ensures a good adhesion of the solar cell construction.

Figure 4:
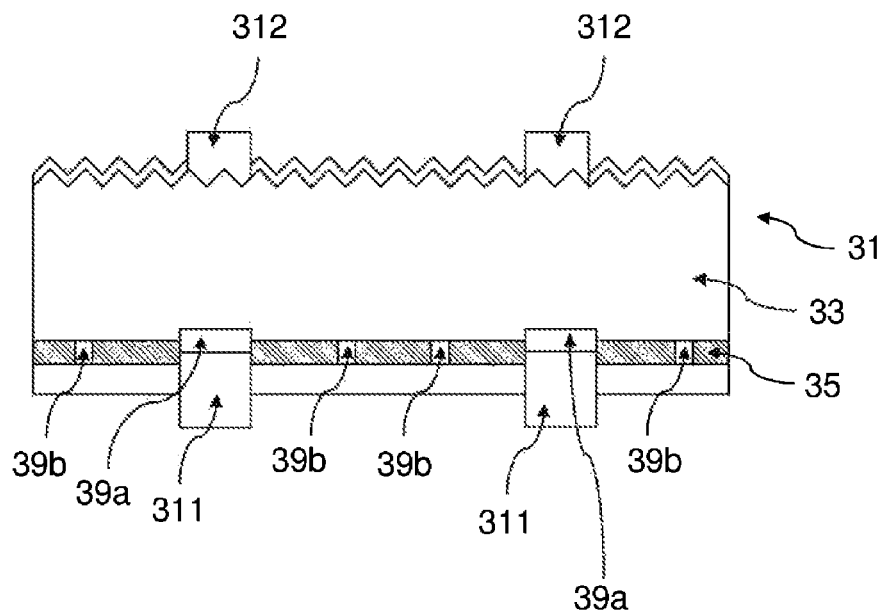
FIG. 4 shows a cross-sectional view of a further solar cell according to the invention.

FIG. 4 shows a cross-sectional view of a further solar cell 31 according to the invention. The solar cell 31 comprises a semiconductor wafer 33. A dielectric layer 35 is arranged on the rear side of the semiconductor wafer 33. A metal layer 37 such as an aluminum layer, for example, is arranged on the dielectric layer 35. Furthermore, the solar cell 31 has two first structures 39a. The first structures 39a are arranged in the dielectric layer 35 and project partly into the semiconductor wafer 33. Furthermore, second structures 39b (four of which are visible) are arranged in the dielectric layer 35, the maximum dimension of said second structures being less than the minimum dimension of the first structure 39a. On that surface of the metal layer 37 which faces away from the semiconductor wafer 33, a connector 311 such as, for example, an aluminum ribbon as interconnecting ribbon (two of which are shown), is arranged in each case in a region which overlaps the first structure 39a in plan view. This overlap can be achieved by the metal layer 37 being perforated by mechanical action, for example, such that the structure 39a is exposed and the connector 311 is contact-connected to the first structure 39a by means of ultrasonic cold welding. Two interconnecting ribbons 312 such as aluminum ribbons, for example, are arranged on the front side of the semiconductor wafer 33.

Figure 5:
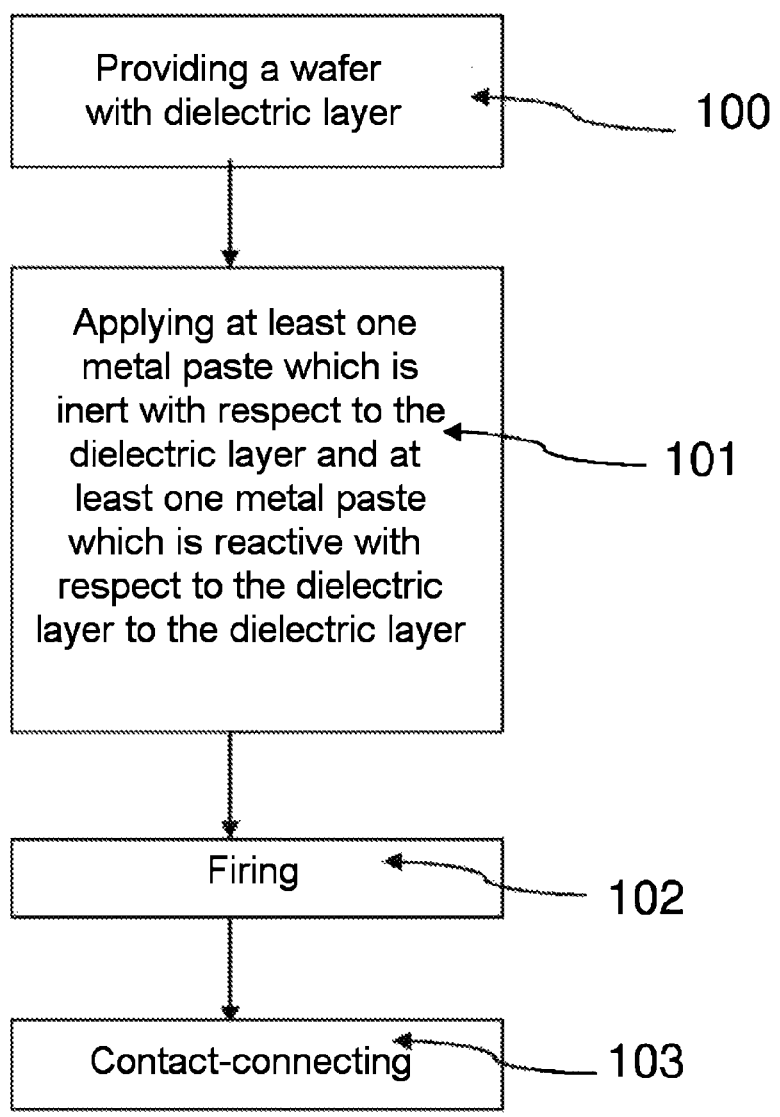
FIG. 5 shows a production method for the solar cell in accordance with FIG. 1.

The method shown in FIG. 5 is one example of a method for producing the solar cell 1 shown in FIG. 1: the method comprises the following steps: providing a wafer with dielectric layer 100; applying at least one metal paste which is inert with respect to the dielectric layer and at least one metal paste which is reactive with respect to the dielectric layer to the dielectric layer 101; firing 102; and contact-connecting 103. Step 100 comprises, for example, providing the semiconductor wafer 3 with a dielectric layer 5 in a device suitable for coating the dielectric layer 5. Step 101 can be effected by means of a screen printing method. The screen printing method makes it possible to apply chemically different metal pastes in defined regions as a layer. The metal paste which is reactive with respect to the dielectric layer 5 is arranged in the metal paste which is inert with respect to the dielectric layer in the manner as shown in FIG. 2, i.e. a layer of metal paste 13 which is inert with respect to the dielectric layer 5 and metal paste 15 which is reactive with respect to the dielectric layer 5 is formed by means of screen printing. Step 102 has the effect that the metal paste 15 which is reactive with respect to the dielectric layer 5 penetrates through the dielectric layer 5, and forms the first structures 9a and the second structures 9b, and the adhesion between the semiconductor wafer 3 illustrated in FIG. 1, the dielectric layer 5 and the metal layer 7 is thus realized. As a result of step 103, the connector 11 is contact-connected to the metal layer 7 and the semiconductor wafer 3 is contact-connected to the interconnecting ribbon 12.

Figure 6:
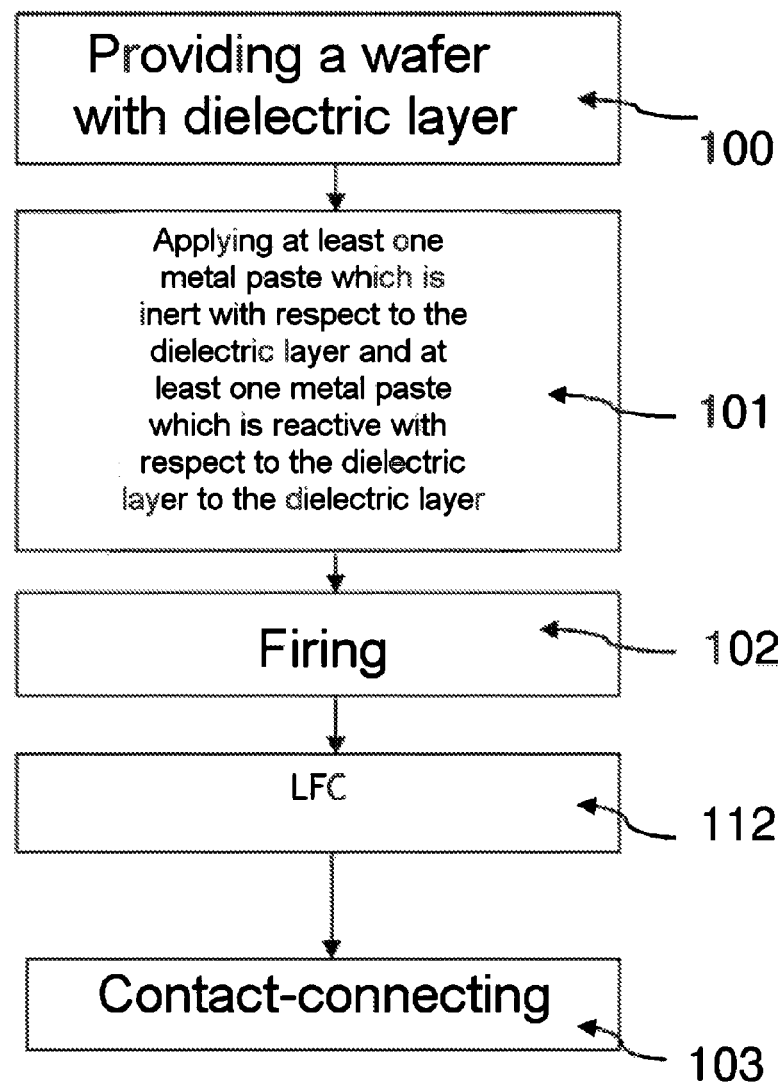
FIG. 6 shows an alternative production method for the solar cell in accordance with FIG. 1.

The method shown in FIG. 6 is a further example of a method for producing the solar cell 1 shown in FIG. 1: the method comprises the following steps: providing a wafer with dielectric layer 100; applying at least one metal paste which is inert with respect to the dielectric layer and at least one metal paste which is reactive with respect to the dielectric layer to the dielectric layer 101; firing 102; forming laser fired contacts (LFC) 112; contact-connecting 103. Step 100 comprises providing the semiconductor wafer 3 with a dielectric layer 5 in a device suitable for coating the dielectric layer 5. Step 101 comprises applying the metal paste 15 which is reactive with respect to the dielectric layer 5 and the metal paste 13 which is inert with respect to the dielectric layer 5, i.e. a layer of metal paste 13 which is inert with respect to the dielectric layer 5 and metal paste 15 which is reactive with respect to the dielectric layer 5 and which is suitable for forming the first structure 9a is formed by means of screen printing. Step 102 has the effect that the metal paste 15 which is reactive with respect to the dielectric layer 5 penetrates through the dielectric layer 5 and forms the first structure 9a, and the metal paste which is inert with respect to the dielectric layer 5 forms the metal layer 7. As a result of step 112, the second structure 9b is formed. As a result of step 103, the connector 11 is contact-connected to the metal layer 7 and the semiconductor wafer 3 is contact-connected to the interconnecting ribbon 12.

Figure 7:
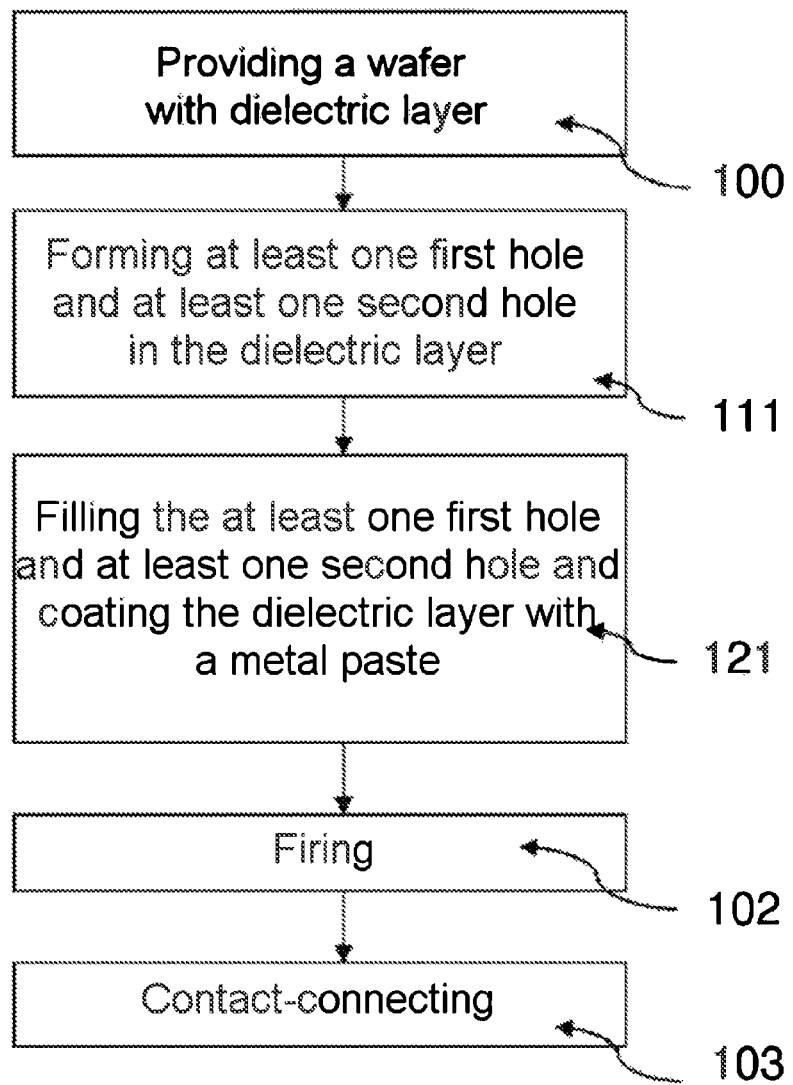
FIG. 7 shows a further alternative production method for a solar cell in accordance with FIG. 1.

The method shown in FIG. 7 is yet another example of a method for producing the solar cell 1 shown in FIG. 1: the method comprises the following steps: providing a wafer with dielectric layer 100; forming at least one first hole and/or at least one second hole in the dielectric layer 111; filling the at least one first hole and/or at least one second hole and coating the dielectric layer with a metal paste 121; firing 102; contact-connecting 103. Step 100 comprises, for example, providing the semiconductor wafer 3 with a dielectric layer 5 in a device suitable for coating the dielectric layer 5. Step 111 can be effected by means of laser ablation. Holes suitable for forming the structures 9a and 9b are formed in the dielectric layer by means of laser ablation. The holes are formed in such a way that the semiconductor wafer 3 is exposed in the hole region. Step 121 comprises applying metal paste which is inert with respect to the dielectric layer 5, such as an aluminum paste, for example. The metal paste fills the holes produced in the dielectric layer 5 and forms a metal paste layer arranged on the dielectric layer 5. Step 102 has the effect that the metal layer 7 is formed on the dielectric layer 5, and that an aluminum-silicon eutectic forms in regions in which the aluminum paste as metal paste is arranged on the semiconductor wafer 3. The adhesion is thus realized between the semiconductor wafer 3 illustrated in FIG. 1, the dielectric layer 5 and the metal layer 7. As a result of step 103, the connector 11 is contact-connected to the metal layer 7 and the semiconductor wafer 3 is contact-connected to the interconnecting ribbon 12.

Figure 8:
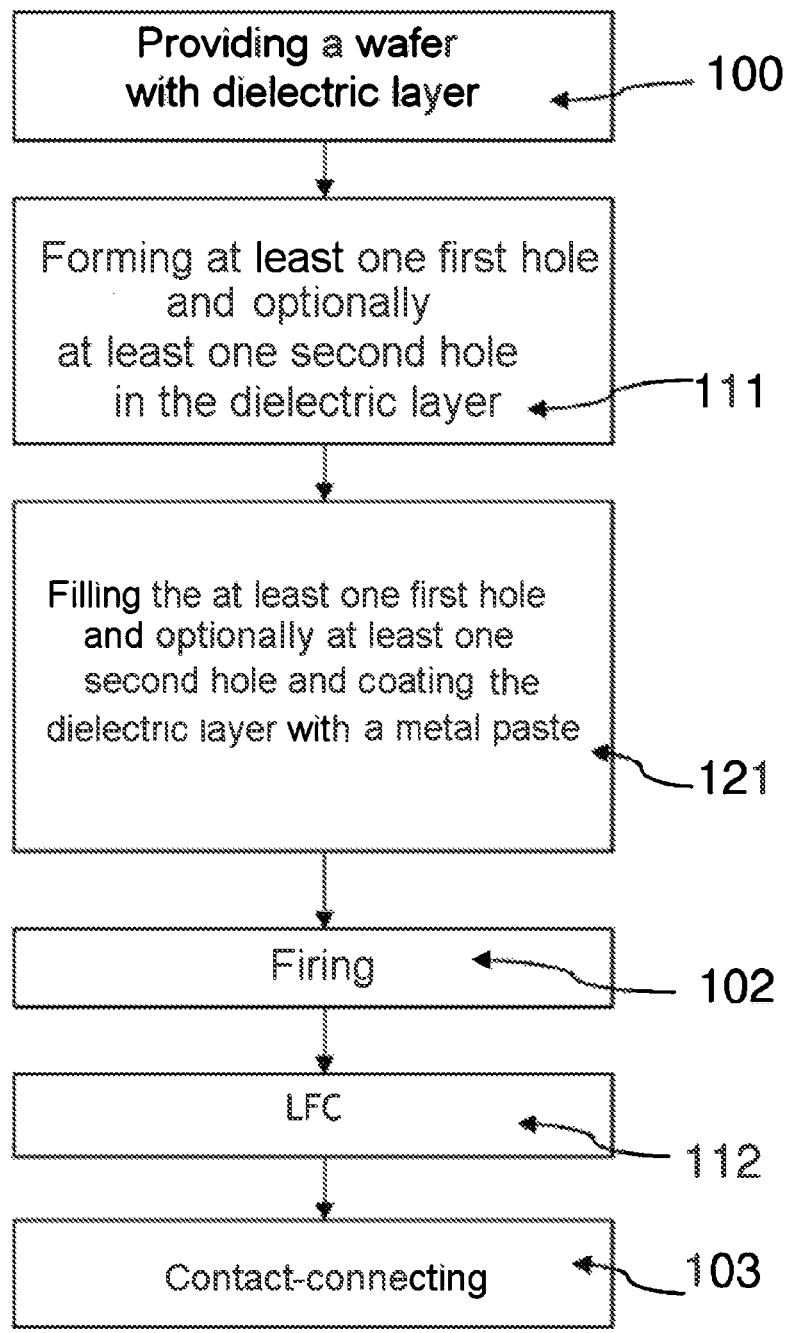
FIG. 8 shows a further alternative production method for a solar cell in accordance with FIG. 1.

The method shown in FIG. 8 is a further example of a method for producing the solar cell 1 shown in FIG. 1. The method comprises the following steps: providing a wafer with dielectric layer 100; forming at least one first hole and optionally at least one second hole in the dielectric layer 111; filling the at least one first hole and optionally at least one second hole and coating the dielectric layer with a metal paste 121; firing 102; forming laser fired contacts (LFC) 112; and contact-connecting 103. Step 100 comprises, for example, providing the semiconductor wafer 3 with a dielectric layer 5 in a device suitable for coating the dielectric layer 5. Step 111 can be effected by means of laser ablation. Holes suitable for forming the first structures 9*a* and optionally the second structures 9*b* are formed in the dielectric layer by means of laser ablation. The holes are formed in such a way that the semiconductor wafer 3 is exposed in the hole region. Step 121 comprises applying metal paste which is inert with respect to the dielectric layer 5. The metal paste fills the holes produced in the dielectric layer 5 and forms a metal paste layer arranged on the dielectric layer 5. Step 102 has the effect that the metal layer 7 is formed on the dielectric layer 5 and the structure 9*a* is formed in the dielectric layer 5, and that an aluminum-silicon eutectic forms in regions in which the aluminum paste as metal paste is arranged on the semiconductor wafer 3. The second structure 9*b* is formed by means of step 112. The combination of steps 111, 121 and 112 results in the formation of a good adhesion between semiconductor wafer 3, dielectric layer 5 and metal layer 7. Step 103 comprises contact-connecting the connector 11 to the metal layer 7 and contact-connecting the semiconductor wafer 3 to the interconnecting ribbon 12.

Figure 9:
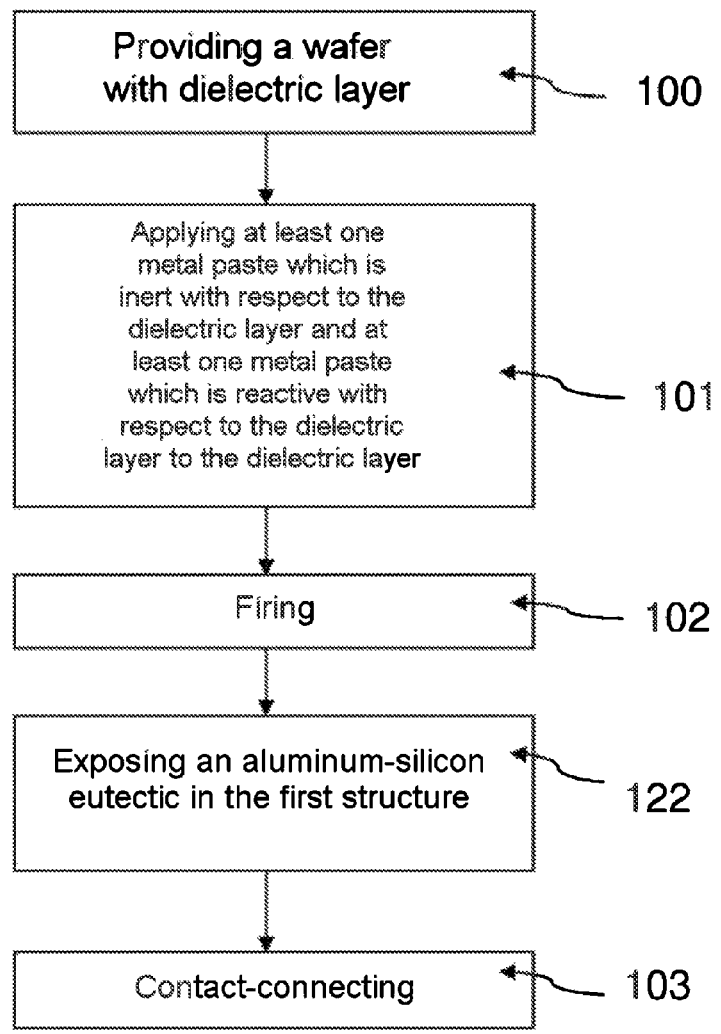
FIG. 9 shows a production method for a solar cell in accordance with FIG. 4.

The method shown in FIG. 9 is one example of a method for producing the solar cell 31 shown in FIG. 4. The method comprises the following steps: providing a wafer with dielectric layer 100; applying at least one metal paste which is inert with respect to the dielectric layer and at least one metal paste which is reactive with respect to the dielectric layer to the dielectric layer 101; firing 102; exposing an aluminum-silicon eutectic in the first structure 122; and contact-connecting 103. Step 100 comprises, for example, providing the semiconductor wafer 33 with a dielectric layer 35 in a device suitable for coating the dielectric layer 35. Step 101 can be effected by means of a screen printing method. Aluminum pastes are used as metal pastes. The metal paste which is reactive with respect to the dielectric layer 35 is arranged in the metal paste which is inert with respect to the dielectric layer in the manner shown in FIG. 2, i.e. a layer of metal paste which is inert with respect to the dielectric layer 35 and metal paste which is reactive with respect to the dielectric layer 35 is formed by means of screen printing. Step 102 has the effect that the metal paste which is reactive with respect to the dielectric layer 35 penetrates through the dielectric layer 35 and forms the first structures 39*a* and the second structures 39*b*, and the adhesion between the semiconductor wafer 33 illustrated in FIG. 4, the dielectric layer 35 and the metal layer 37 is thus realized and an aluminum-silicon eutectic forms at the interface between semiconductor wafer 33 and metal layer 37. As a result of step 122, the aluminum-silicon eutectic of the first structure 39*a* formed during firing is exposed by means of laser ablation. As a result of step 103, the connector 311 is contact-connected to the aluminum-silicon eutectic and the semiconductor wafer 33 is contact-connected to the interconnecting ribbon 312.

The method shown in FIG. 9 corresponds to the method shown in FIG. 5, wherein step 122, namely exposing an aluminum-silicon eutectic, is performed before step 103. If, in the methods shown in FIGS. 6 to 8, step 122 is performed before step 102, the methods shown in said figures are suitable for producing the solar cell 31 shown in FIG. 4.

LIST OF REFERENCE SIGNS

1 Solar cell
3 Semiconductor wafer
5 Dielectric layer
7 Metal layer
9*a* First structure
9*b* Second structure
11 Connector
12 Interconnecting ribbon
13 Metal paste which is inert with respect to the dielectric layer
15 Metal paste which is reactive with respect to the dielectric layer
31 Solar cell
33 Semiconductor wafer
35 Dielectric layer
37 Metal layer
39*a* First structure
39*b* Second structure
100 Providing a wafer with dielectric layer
101 Applying at least one metal paste which is inert with respect to the dielectric layer and at least one metal paste which is reactive with respect to the dielectric layer to the dielectric layer
102 Firing
103 Contact-connecting
111 Forming at least one first hole and/or at least one second hole in the dielectric layer
112 Forming laser fired contacts
121 Filling the at least one first hole and/or at least one second hole and coating the dielectric layer with a metal paste
122 Exposing an aluminum-silicon eutectic in the first structure
311 Connector
312 Interconnecting ribbon
$L_{min}$ Minimum length
$L_{max}$ Maximum length

The invention claimed is:

1. A solar cell comprising:
   a semiconductor wafer,
   at least one dielectric layer arranged on the semiconductor wafer,
   a metal layer arranged on the dielectric layer, and
   a contact structure arranged in the dielectric layer such that the contact structure provides an electrical connection between the metal layer and the semiconductor wafer,
   wherein the contact structure has at least one first structure having a minimum dimension and at least one second structure having a maximum dimension, wherein the minimum dimension and the maximum dimension are defined along a surface of the semiconductor wafer and the minimum dimension of the first structure is greater than the maximum dimension of the second structure.

2. The solar cell as claimed in claim 1, wherein the minimum dimension of the first structure is in the millimeters range and the maximum dimension of the second structure is in the micrometers range.

3. The solar cell as claimed in claim 2, wherein the millimeters range comprises 0.1 to 10 mm and the micrometers range comprises 10 to 70 µm.

4. The solar cell as claimed in claim 1, wherein the first structure comprises an aluminum-silicon eutectic and/or the second structure comprises a silicon-metal contact or a laser fired contact (LFC).

5. The solar cell as claimed in claim 1, wherein the first structure has a strip-type shape.

6. The solar cell as claimed in claim 1, wherein the second structure has a punctiform shape.

7. The solar cell as claimed in claim 1, wherein on a surface of the metal layer which faces away from the semiconductor wafer, a connector is arranged in a region which overlaps the first structure in plan view.

8. The solar cell as claimed in claim 4, wherein the first structure comprises an aluminum-silicon eutectic which is directly contact-connected to a connector.

9. A solar cell production method, comprising the following method steps:
- providing a semiconductor wafer with at least one dielectric layer,
- forming a metal layer on the dielectric layer and a contact structure arranged in the dielectric layer such that the contact structure provides an electrical connection between the metal layer and the semiconductor wafer wherein at least one first structure having a minimum dimension and at least one second structure having a maximum dimension are formed as contact structure, such that the minimum dimension of the first structure is greater than the maximum dimension of the second structure.

10. The production method as claimed in claim 9, wherein the forming the metal layer and the contact structure comprises the following method steps:
- applying at least one metal paste which is inert with respect to the dielectric layer and at least one metal paste which is reactive with respect to the dielectric layer to the dielectric layer, such that the metal paste which is reactive with respect to the dielectric layer forms at least one first region and/or at least one second region in the metal paste which is inert with respect to the dielectric layer; and
- firing, such that the metal paste which is reactive with respect to the dielectric layer and forms the first and/or second region penetrates through the dielectric layer and forms the first structure and/or the second structure.

11. The production method as claimed in claim 9 wherein the forming the metal layer and the contact structure comprises the following method steps:
- forming at least one first hole suitable for producing the first structure and/or at least one second hole suitable for producing the second structure in the dielectric layer; and
- filling the at least one first hole and/or at least one second hole and coating the dielectric layer with a metal paste; and
- firing.

12. The production method as claimed in claim 11, further comprising, forming the at least one first hole and/or the at least one second hole by means of laser ablation.

13. The production method as claimed in claim 9, further comprising
- producing the second structure by means of LFC (laser fired contacts).

14. The production method as claimed in claim 9, further comprising applying at least one connector on a surface of the metal layer which faces away from the semiconductor wafer in at least one region which overlaps the first structure in plan view.

15. The production method as claimed in claim 9, further comprising exposing an aluminum-silicon eutectic in at least one first structure and ultrasonic cold welding of the aluminum-silicon eutectic of the first structure to a respective connector.

* * * * *